US008829766B2

(12) United States Patent
Milyutin et al.

(10) Patent No.: US 8,829,766 B2
(45) Date of Patent: Sep. 9, 2014

(54) PIEZOELECTRIC RESONATOR OPERATING IN THICKNESS SHEAR MODE

(75) Inventors: Evgeny Milyutin, Ecublens (CH); Paul Muralt, La Sarraz (CH)

(73) Assignee: Epcos AG, Munich (DE)

( * ) Notice: Subject to any disclaimer, the term of this patent is extended or adjusted under 35 U.S.C. 154(b) by 63 days.

(21) Appl. No.: 13/056,677

(22) PCT Filed: Jul. 28, 2009

(86) PCT No.: PCT/IB2009/053274
§ 371 (c)(1),
(2), (4) Date: Jan. 31, 2011

(87) PCT Pub. No.: WO2010/013197
PCT Pub. Date: Feb. 4, 2010

(65) Prior Publication Data
US 2011/0121683 A1 May 26, 2011

Related U.S. Application Data

(60) Provisional application No. 61/085,479, filed on Aug. 1, 2008.

(51) Int. Cl.
H01L 41/04 (2006.01)
H03H 9/58 (2006.01)
H03H 9/17 (2006.01)
H01L 41/107 (2006.01)
H03H 9/56 (2006.01)
H03H 9/02 (2006.01)

(52) U.S. Cl.
CPC ............ *H01L 41/107* (2013.01); *H03H 9/583* (2013.01); *H03H 9/171* (2013.01); *H03H 9/562* (2013.01); *H03H 9/175* (2013.01); *H03H 9/02015* (2013.01)
USPC ............ 310/335; 310/333; 310/358; 310/359

(58) Field of Classification Search
USPC .................. 310/335, 358, 359, 332
See application file for complete search history.

(56) References Cited

U.S. PATENT DOCUMENTS 3,831,116 A  8/1974 Davis, Jr. et al.
4,425,554 A  1/1984 Morishita et al.
(Continued)

FOREIGN PATENT DOCUMENTS

EP  0173332  3/1986
RU  849428   7/1981
(Continued)

OTHER PUBLICATIONS

Lakin, K.M., K.T. McCarron, and R.E Rose. Solidly mounted resonators and filters. in IEEE Ultrasonics Symposium. 1995. Seattle (Washington, USA): IEEE, p. 905-908.
(Continued)

*Primary Examiner* — Derek Rosenau
*Assistant Examiner* — Bryan Gordon
(74) *Attorney, Agent, or Firm* — Sturm & Fix LLP

(57) ABSTRACT

An acoustic wave resonator device comprising a resonant layer that comprises a series of side-by-side areas of first and second dielectric materials. In one embodiment the first dielectric material is a piezoelectric, in particular the first dielectric material can be a piezoelectric and the second dielectric material can be non-piezoelectric. In another embodiment, the first dielectric material is a piezoelectric of first polarity and the second dielectric material is a piezoelectric of opposite polarity or different polarity. Where needed, the resonant layer is supported on a reflector composed of series of layers of high acoustic impedance material(s) alternating with layers of low acoustic impedance material(s). For example, the reflector comprises AlN, $Al_2O_3$, $Ta_2O_5$, $HfO2$ or W as high impedance material and $SiO2$ as low impedance material.

16 Claims, 6 Drawing Sheets

(56) References Cited

U.S. PATENT DOCUMENTS

| | | | |
|---|---|---|---|
| 6,111,684 A * | 8/2000 | Forgette et al. | 359/267 |
| 7,030,718 B1 | 4/2006 | Scherer | |
| 8,330,325 B1 * | 12/2012 | Burak et al. | 310/320 |
| 2002/0135270 A1 * | 9/2002 | Ballandras et al. | 310/313 R |
| 2003/0218517 A1 * | 11/2003 | Kaida et al. | 333/187 |
| 2005/0057324 A1 * | 3/2005 | Onishi et al. | 333/191 |
| 2005/0200433 A1 * | 9/2005 | Aigner et al. | 333/191 |
| 2006/0139122 A1 | 6/2006 | Asai et al. | |
| 2007/0096851 A1 * | 5/2007 | Uno et al. | 333/191 |
| 2007/0216735 A1 * | 9/2007 | Kobayashi et al. | 347/68 |
| 2008/0238576 A1 * | 10/2008 | Takahashi et al. | 333/195 |
| 2009/0002098 A1 * | 1/2009 | Mayer et al. | 333/189 |

FOREIGN PATENT DOCUMENTS

| | | |
|---|---|---|
| WO | 0207310 | 1/2002 |
| WO | 2008033844 | 3/2008 |

OTHER PUBLICATIONS

Ruby, R.C., P. Bradley, Y. Oshmyansky, A. Chien, and J.D. Larson. Thin film bulk acoustic wave resonators for wireless applications. in IEEE Ultrasonics Symposium. 2001. Atlanta: IEEE, p. 813-821.

Lanz, R. and P. Muralt, Bandpass filters for 8 GHz using solidly mounted bulk acoustic wave resonators. IEEE Trans. UFFC, 2005. 52: p. 936-946.

Winggvist, G. Bjurstrom, J. Liljeholm, L. Katardjiev, I. Spetz, A.L., Shear mode AlN thin film electroacoustic resonator for biosensor applications. Sensors, 2005 IEEE, 2005, 4 p. 492-495.

Martin, F. Muralt, P, Cantoni, M. and Dubois M.-A. Re-growth of c-axis oriented AlN thin films. In IEEE Ultrasonics Symposium 2004, p. 169-172.

E. Milyutin, S. Gentil, P. Muralt, Shear mode bulk acoustic wave resonator based on C-axis oriented AlN thin film, J. Appl. Phys. vol. 104, No. 084508 (2008).

Copy—5 pages, European Search Report for Application No. EP09802598.

\* cited by examiner

PIEZOELECTRIC RESONATOR OPERATING IN THICKNESS SHEAR MODE

This application is a 371 of international application No. PCT/IB2009/053274 filed Jul. 28, 2009, which claims the benefit of U.S. Application Ser. No. 61/085,479 filed Aug. 1, 2008 which is incorporated by reference herein in its entirety.

FIELD OF THE INVENTION

The present invention relates generally to piezoelectric micro-devices and, in particular, to thin film resonators operating in thickness-shear mode. Potential applications are in sensors, RF oscillators and transformers.

BACKGROUND OF THE INVENTION

A list of referenced documents is appended to the end of the Description.

Piezoelectric resonators are electro-mechanical resonators. The resonance is due to shape, density and elastic constants of the mechanically resonating body containing piezoelectric material. The piezoelectric effect permits to couple the mechanical resonance to an electric circuit. The use of piezoelectric thin films allows very large resonance frequencies in the 1-10 GHz range by trapping a bulk acoustic wave within the piezoelectric film slab. This is of great interest for wireless communication. Thin film piezoelectric resonators are indeed commercialized for applications in mobile phones. Main product is the RF filter at the carrier frequency in the receiver and emitter path. Such filters need a large pass band, meaning large piezoelectric coupling. For this reason, the largest piezoelectric coefficient is employed, i.e. the electric field is applied parallel to the polar c-axis (coefficient $e_{33}$). It happens that AlN and ZnO films can be very well grown in (001) texture, that is with the c-axis (index 3 in the crystal system) perpendicular to the film plane (this direction is designed with index z of the coordinate system). The electric field is then very conveniently applied between two parallel plate electrodes sandwiching the piezoelectric film. The piezoelectric effect is then written for instance as change of stress $T_z = e_{33} E_z$. Using this mode, a longitudinal wave running along the 3-direction is trapped in the film slab, excited through the largest possible coupling based on $e_{33}$. Informations on this kind of devices are found for instance in the articles: Lakin [1], Ruby [2], Lanz [3].

Another promising application of the thin film bulk acoustic wave resonators (TFBAR's) has been identified in gravimetric sensing. High quality factor and high frequency make such device very sensitive to any particles or films that agglomerate at the surface of the device. However, such sensors are not able to operate in a liquid when using longitudinal waves as for mobile phones. The liquid is damping too much the resonance because longitudinal waves are emitted from the resonator into the liquid. Contrary to that, resonators that operate on shear acoustic waves will not be damped so much, because there is only a weak shear coupling into liquids. Shear waves do not propagate in liquids, and thus do not absorb energy from the resonator. A schematic view of a shear mode resonator combined with an immobilization layer to obtain gravimetric sensing is shown in FIG. 1.

Excitation of shear waves in thin films was proposed in several ways. A first solution is tilted c-axis growth (Wingqvist, (Sensors, 2005 IEEE)[4]). The electrode geometry is the same as for mobile phone RF filters, however, the c-axis in the piezoelectric film is tilted away from the vertical (direction 3) by the angle alpha. In this geometry, quasi-shear waves running along the 3-direction are excited by an electric field pointing along the 3-axis, and are trapped in the film at resonance. The main disadvantage of this technique is the need for non-standard deposition tools and large difficulties to achieve uniform c-axis tilting. A second solution is to provide an in-plane electric field by means of interdigitated electrodes along with standard (001) AlN films. The advantage is thus that standard films with good uniformities can be used. The disadvantage is the creation of an $S_3$ component of strain below the electrode fingers, leading to a longitudinal wave component, and thus to emission into the liquid. The quality factor is thus not as optimal as it could be, even though better Q's were observed than with tilted c-axis growth (see article [6] of the inventors).

The publication Martin [5] discloses background information on growing thin AlN films, in particular with differently treated areas yielding different polarization.

SUMMARY OF THE INVENTION

The objective of this invention is to provide a way of pure shear acoustic wave excitation that can make use of standard AlN thin films (c-axis oriented). This is an improved version of the above-mentioned second solution.

According to a main aspect of the invention, there is provided an acoustic wave resonator device comprising a resonant layer that comprises a series of side-by-side areas of first and second dielectric materials. These materials can in particular be piezoelectric and non-piezoelectric materials, or piezoelectric materials with different polarities.

Thus, in one embodiment the first dielectric material is a piezoelectric and the second dielectric material can be non-piezoelectric, such as a disordered piezoelectric material with no or substantially no piezoelectric effect. In another embodiment, the first dielectric material is a piezoelectric of first polarity and the second dielectric material is a piezoelectric of opposite polarity or of different polarity (e.g. with vertical and horizontal orientations), in other words of different piezoelectric properties.

Where needed, the resonant layer is supported on a reflector composed of series of layers of high acoustic impedance material(s) alternating with layers of low acoustic impedance material(s). For example, the reflector comprises at least one of AlN, Al2O3 or W as high impedance material and SiO2 as low impedance material. Also these materials can be mixed or used in combination. For example, one layer of high impedance material can be W, and another layer of high impedance material can be AlN or Al2O3 in the same reflector.

In another embodiment, the resonant layer is a membrane with mechanically free surfaces.

The piezoelectric material is typically AlN, ZnO or GaN.

The inventive acoustic wave resonator device can comprise an electrode system allowing excitation of shear thickness resonance of acoustic waves, or an electrode system allowing in-phase electric filed production in piezoelectric parts of the resonant layer.

The inventive acoustic wave resonator device can comprise interdigitated electrodes.

In order to compensate for non-uniform loading of the inventive acoustic wave resonator device, it can also comprise a patterned electrodes system consisting of patterned electrodes made of an electrically-conductive first material separated by an electrically non-conductive second material with similar mechanical properties to the first material. For example the first material of the electrodes is based on Al and the second material is SiO2.

The inventive acoustic wave resonator device can be incorporated in a media sensing apparatus, in particular a media sensing apparatus for liquid immersion. The invention also concerns an integrated circuit device, in particular a transformer, comprising an acoustic wave resonator device as set out above.

The invention also provides a piezoelectric transformer comprising: an input part (which is assimilated to the primary winding of the transformer); a matching part; and an output part (which is assimilated to the secondary winding of the transformer), wherein the input part or primary winding comprises the inventive acoustic wave resonator device, the output part or secondary winding comprises a piezoelectric material and the matching part is arranged to acoustically couple the input and output parts constituting the primary and secondary windings. This output part can be made of AlN or ZnO and the matching part made of $SiO_2$.

BRIEF DESCRIPTION OF THE DRAWINGS

The invention will further be described by way of example with reference to the accompanying drawings, in which.

DETAILED DESCRIPTION OF THE PREFERRED EMBODIMENT

Figure 2:
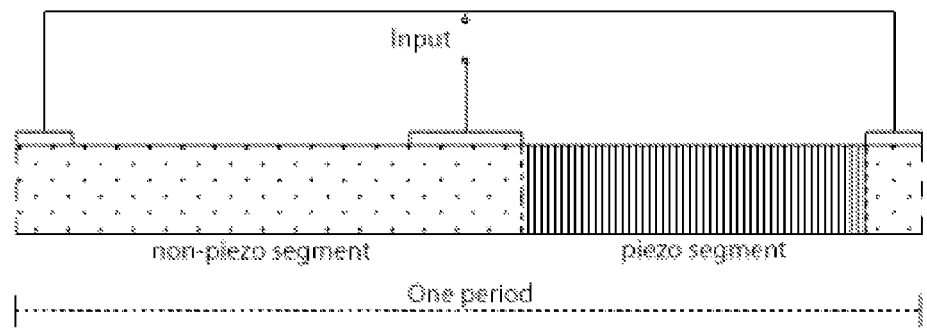
FIG. 2 is a schematic cross-section through a part of one embodiment of a resonator according to the invention composed of alternatively piezo and non-piezoelectric segments, complying with the electrode system for optimal excitation, and showing the principle of the design.

In FIG. 2, one period of a (002) AlN film patterned alternately with piezo and non-piezo regions is shown. Excitation of shear acoustic wave is possible in this case by applying an electric field in such a way that in every piezo-active region the electric field is in phase with the wave. Then, non-piezo regions do not react on the electric field, they just follow the motion of piezoelectric regions adjacent to them resulting in a perfect shear motion of the film.

Figure 3:
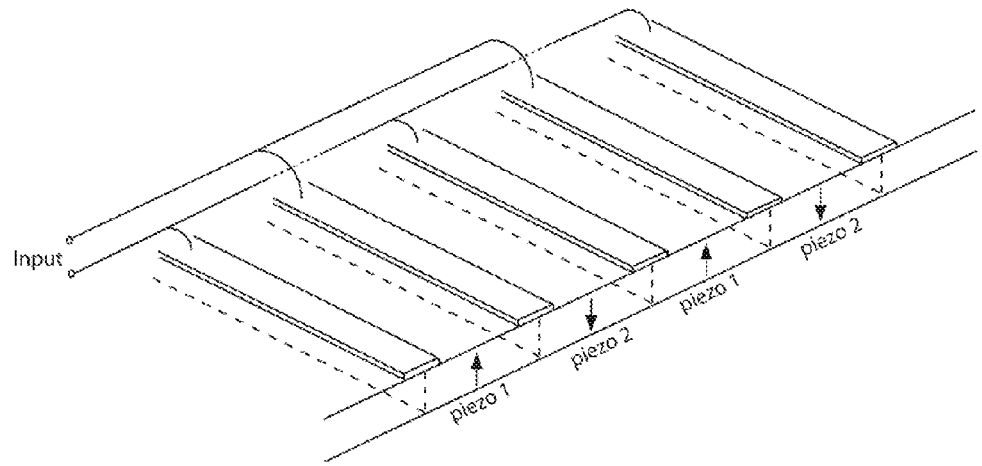
FIG. 3 is a schematic perspective view of a modification of this resonator using alternative polarities of the piezoelectric material.

FIG. 3 shows a perspective view of multiple periods of the resonator in the case of a modification where the alternating regions are piezoelectric regions of different polarities, in this case with opposite polarities.

FIG. 3 also shows the electrical connection of the alternating electrodes to opposite poles of the electric supply. The given configuration of the electrodes on the upper face of the resonator adjacent the boundaries of the piezo and non-piezo regions or the piezoelectric regions of different polarities (see FIGS. 2, 3 and 4) enables the electric field to be produced in phase with the waves corresponding to the piezoelectric material or the piezoelectric regions of different polarities. However, the same effect can be achieved even if the electrodes are shifted slightly but still remain close to the boundaries between the different regions.

Figure 4:
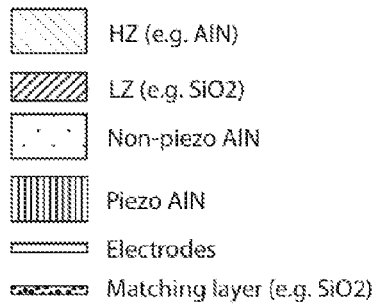
FIG. 4 is a cross-section showing the solidly mounted resonator based on piezo-patterned AlN thin film wherein an acoustic reflector is applied to concentrate the resonance within the AlN layer.
Figure 4:
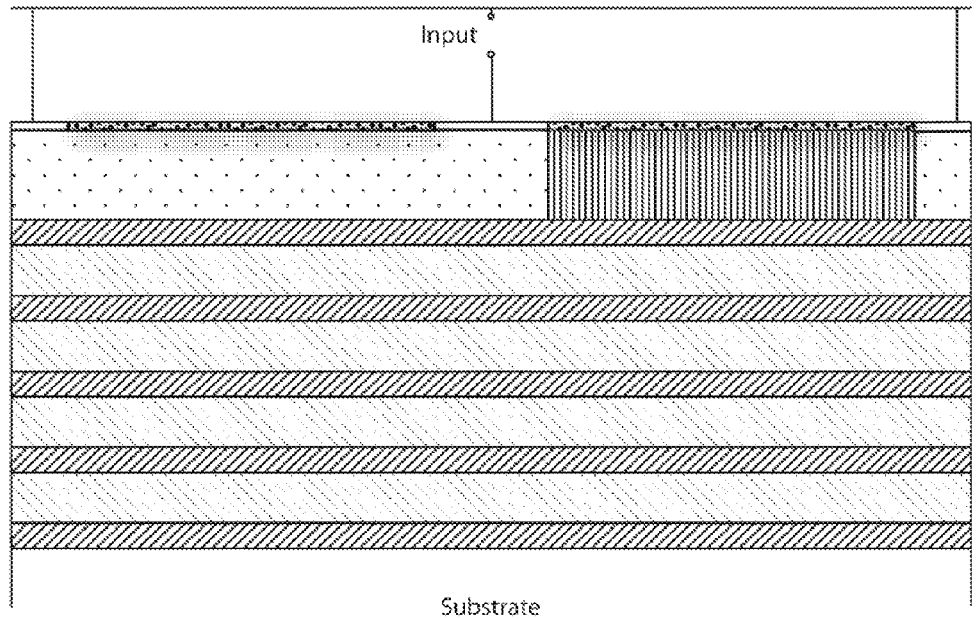

As illustrated in FIGS. 2, 3 and 4, the adjacent areas of piezo and non-piezo material, or piezo materials of different polarities, are of unequal length. However, the adjacent areas could be of the same length and equally spaced, if desired, as in case of oppositely polar regions.

In particular for AlN substrates, alternating piezo and non-piezo regions can be obtained by modulating the surface roughness of the $SiO_2$ substrate on which the AlN is grown. In smooth areas piezoelectric regions will grow. In areas roughened for example by depositing polycrystalline silicon on the $SiO_2$, the AlN still grows but is non-piezoelectric.

Piezoelectric areas of different polarities can be obtained as described in reference [5].

Figure 5:
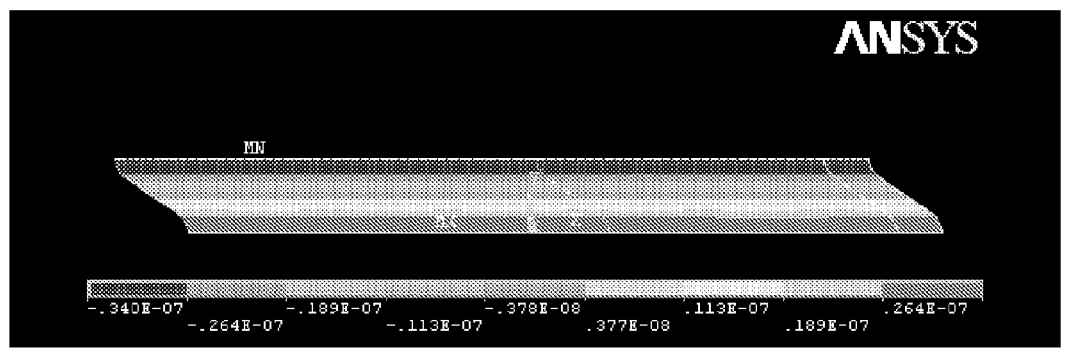
FIG. 5 shows the simulated motion of a free film at resonance frequency with a structure like that shown in FIG. 2; the electrodes are defined as infinitely thin.
Figure 6:
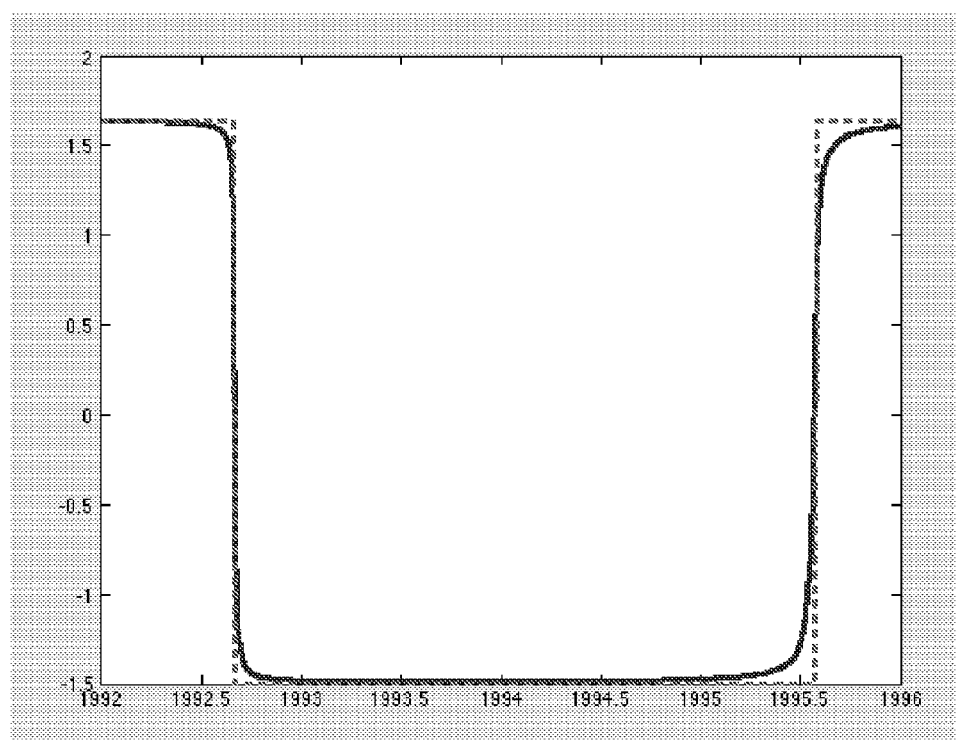
FIG. 6 is a graph of electrical admittance against frequency for a resonator according to the invention (as in FIG. 2).

In FIGS. 5 and 6, results of device simulations are shown, treating the ideal case of a free, segmented layer as defined in FIG. 2. The piezoelectric segment is c-axis oriented AlN with standard properties, and the non-piezoelectric AlN has the same mechanical properties. The motion at resonance frequency is represented in FIG. 5. Thickness shear displacement of the structure can be clearly identified. The displacements are according to a pure shear mode, as desired, and required for gravimetric sensing.

This modeling was done under condition that both surfaces of the film are exposed to air. In order to emphasize ability of excited mode to operate in water without much damping, modeling with a condition that top surface of the film is exposed to water was implemented. Comparison of the properties of the resonance in case of water and air are shown on FIG. 6. Damping by the water is small. The Q factor amounts still to over 50000 (from FIG. 6), which is largely acceptable. Other losses (acoustic losses in materials, resistive losses in the electrodes, excitation of Lamb waves, etc.) of a real device are larger.

The shown example represents the principle of excitation of shear acoustic waves in an c-axis oriented AlN or ZnO film. In a real device, an acoustic isolation is needed. Both known principles, the membrane resonator (material below the resonator is locally etched away to form bridge or membrane structures) and the solidly mounted resonator (SMR) based on an acoustic reflector can be proposed. The SMR type (as shown in FIG. 4) seems to be more promising than the membrane one. The reflector in SMR should be acoustically matched with the resonator. For designs of Bragg reflector, high (HZ) and low (LZ) acoustic impedance materials should be used, preferentially electrical insulators, for example, HL=$SiO_2$ and HZ=AlN, $Al_2O_3$, $Ta_2O_5$, $HfO_2$, or W (though with limitations). All theses films can be deposited by sputtering techniques. Sputtering of c-axis AlN films is well known in the art and high uniformity of deposited films is achieved in industry nowadays. The process of deposition of $SiO_2$ films is also well-known. Thicknesses of layers should be in range of 0.5-1.5 microns in order to obtain resonance around 2.4 GHz. An electrodes system can be defined by photolithography or by evaporative shadow mask.

When operating at GHz frequencies, loading of the electrodes becomes significant, possibly affecting the performance. This problem can be cured by a using matching layer of some dielectric material that has similar acoustic properties to the electrodes and is located between the electrodes, as shown in FIG. 4. For example, aluminum and silicon dioxide ($SiO_2$) may be used as materials for electrodes and matching dielectric respectively.

Different processes to create non-piezoelectric AlN are now under study. As described above, one possibility is to apply a surface modification on the areas where piezoelectricity has to vanish. For instance, surface roughness is introduced to reduce surface diffusion of the atoms of sputtered film and provoke random nucleation of grain orientation.

Figure 7:
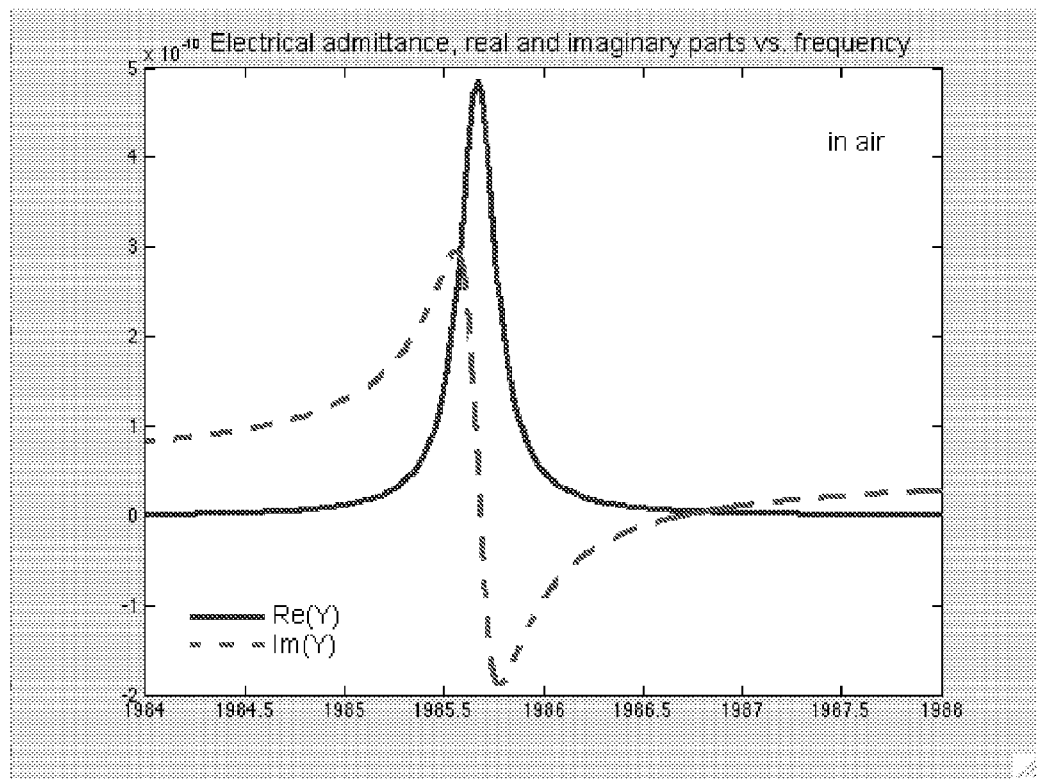
FIG. 7 is a graph showing the electrical admittance against frequency for a resonator according to the invention (as in FIG. 4) under operations in air, showing real and imaginary parts vs frequency, assuming HZ=AlN, and LZ=$SiO_2$.
Figure 8:
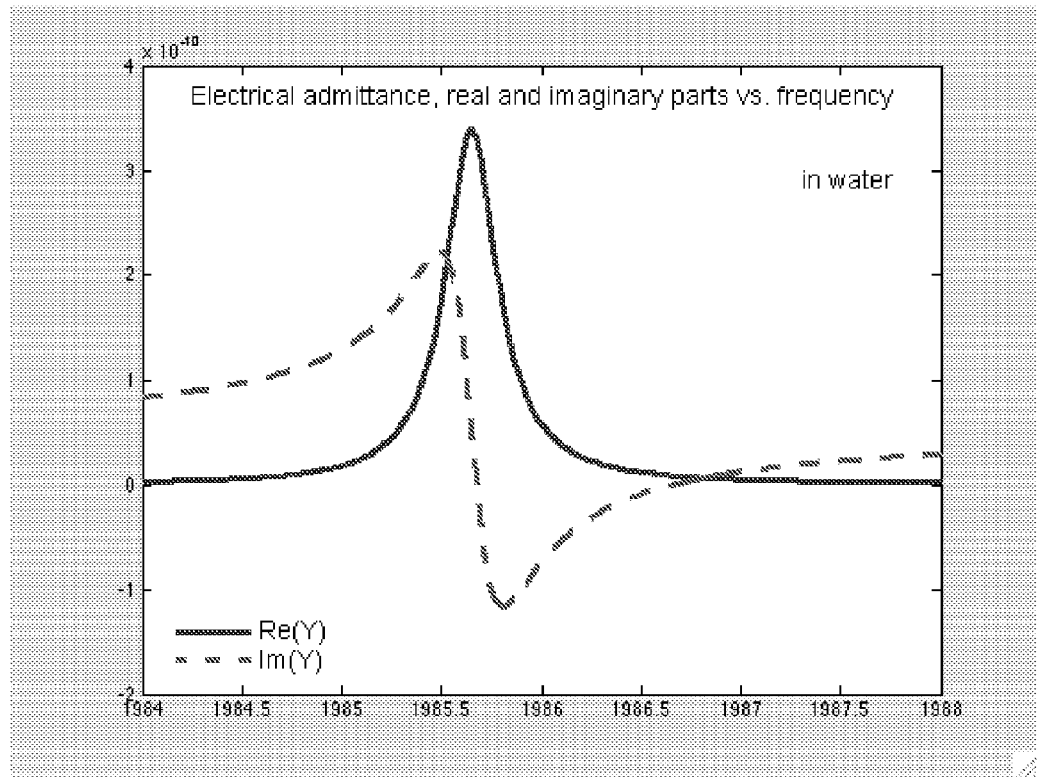
FIG. 8 is a graph showing the electrical admittance against frequency for a resonator according to the invention (same as FIG. 7) under operations in water, showing real and imaginary parts vs frequency.
Figure 9:
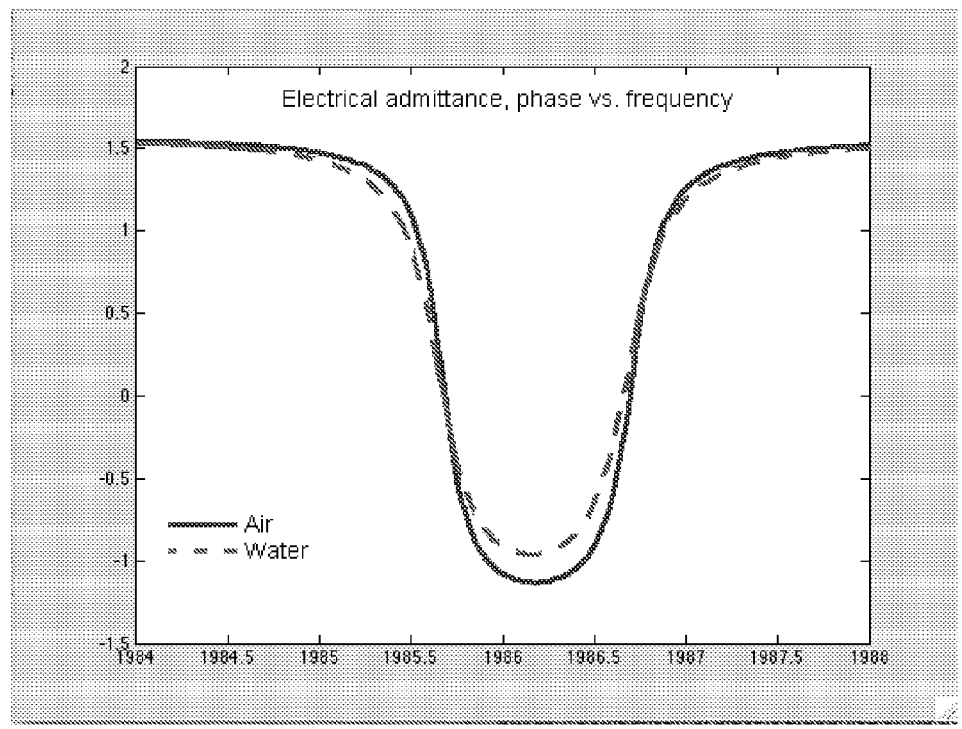
FIG. 9 is a graph showing a simulation of the phase of the electrical admittance for a resonator according to the invention under operations in air (solid line) and water (dashed line) (from simulation data as FIGS. 7 and 8).

The results of a realistic SMR design are presented in FIG. 4. AlN and $SiO_2$ can be used as materials for the reflector, but as mentioned above, other materials with high and low acoustic impedance also could be used. In FIGS. 7 and 8, simulated electrical properties of a realistic resonator under operation in air and water are shown. The phase images of the resonance in liquid and water are shown in FIG. 9. The derived Q-factors amount to 9000 and 6000, respectively.

Figure 10:
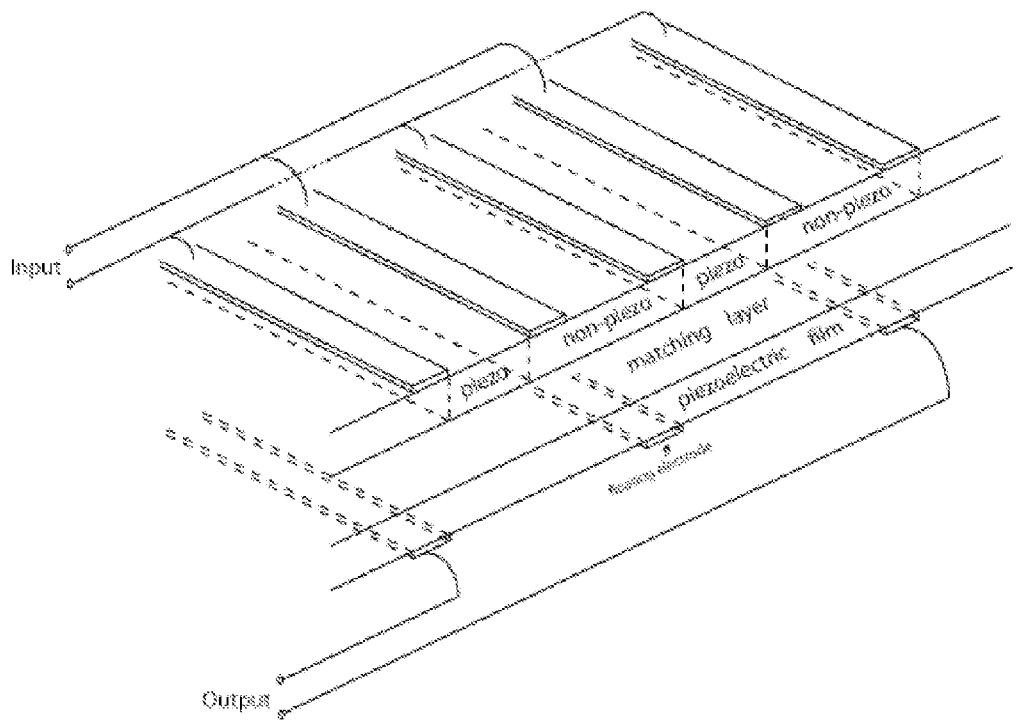
FIG. 10 is a schematic perspective view of a sample design of a transformer based for example on a piezo-patterned film of AlN.

Demonstrated results mean that also in SMR design radiation losses into the liquid are not the dominant loss mechanisms. Shear type of the motion of the device can be seen from FIG. 10, where behavior of the SMR at resonance frequency is shown.

Figure 12:
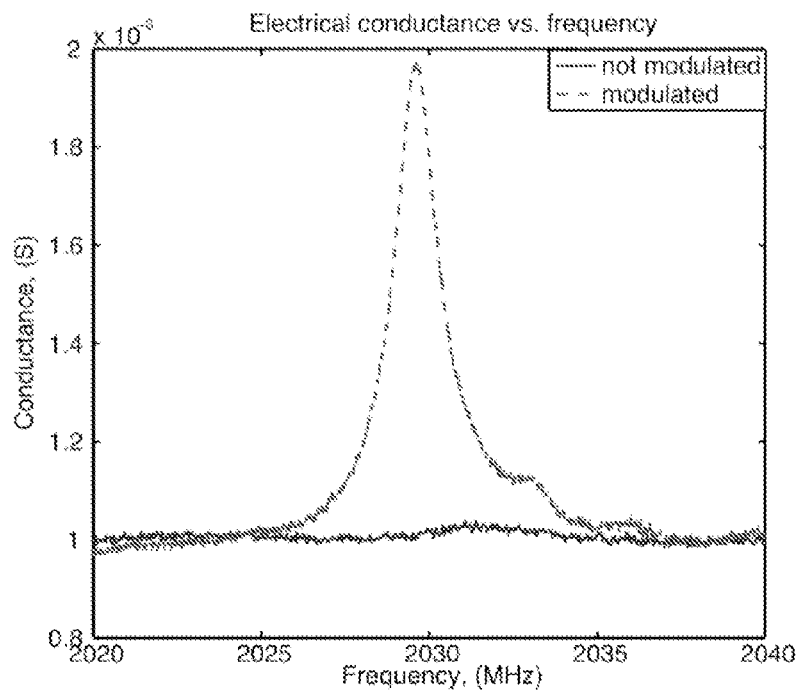
FIG. 12 is a graph showing the electrical conductance vs frequency for a device modulated according to the invention and a comparative non-modulated device.

FIG. 12 shows the electrical conductivity vs frequency for a device modulated according to the invention and a comparative non-modulated device. The device according to the invention had side-by-side areas of different piezoelectric properties wherein an AlN piezoelectric film has areas with ordered AlN for the first type of dielectric and disordered AlN with reduced piezoelectric properties for the second type of dielectric. The comparative non-modulated device was fabricated on the same wafer but with a uniform AlN piezoelectric film. The devices were otherwise identical and close to each other to exclude any variation of film properties. As can be seen in FIG. 12, a resonance frequency is formed at around 2.0 GHz in the inventive modulated device, but not in the non-modulated comparative device.

EXAMPLES

The following examples are presented to describe some practical applications of the invention.

Example 1

High Performances In-Liquid Sensing

Figure 1:
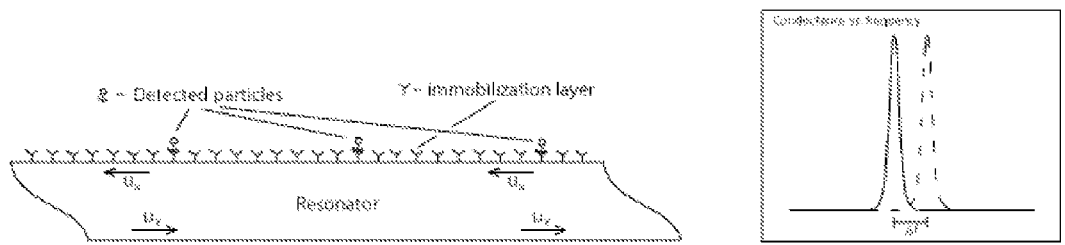
FIG. 1 shows principle of a resonator as a sensor.

A principle of in-liquid sensor based on shear mode resonator is shown in FIG. 1. The top surface of the device is functionalized to attract certain types of impurities from liquid. Once the impurities are attached to the surface, acoustic properties of the resonator have been changed and that results in a shift of resonance frequency. By the size of shift, the quantity of attracted substances can be determined and conclusions drawn about the concentration of the impurities in the liquid. By using different chemical tools for functionalization of the surface it is possible to fabricate sensors for different kinds of impurities. Generally speaking, everything that can affect acoustic properties of the resonator may be detected.

In fact, such sensor is the analog of the well-known quartz crystal microbalance (QCM) device that provides sensing in a similar way. QCM is based on a special cut of mono-crystal of quartz and then is polished to be a thin plate. The polishing process puts restrictions on the limit thickness of the plate, and so induces a limit of several MHz for the resonance frequency of QCM. That is very important, because the relative sensitivity of such device is proportional to the operating frequency. So, a sensor operated at GHz frequencies is hundreds of times more sensitive in comparison with a standard QCM.

Example 2

Piezoelectric Transformer

Figure 11:
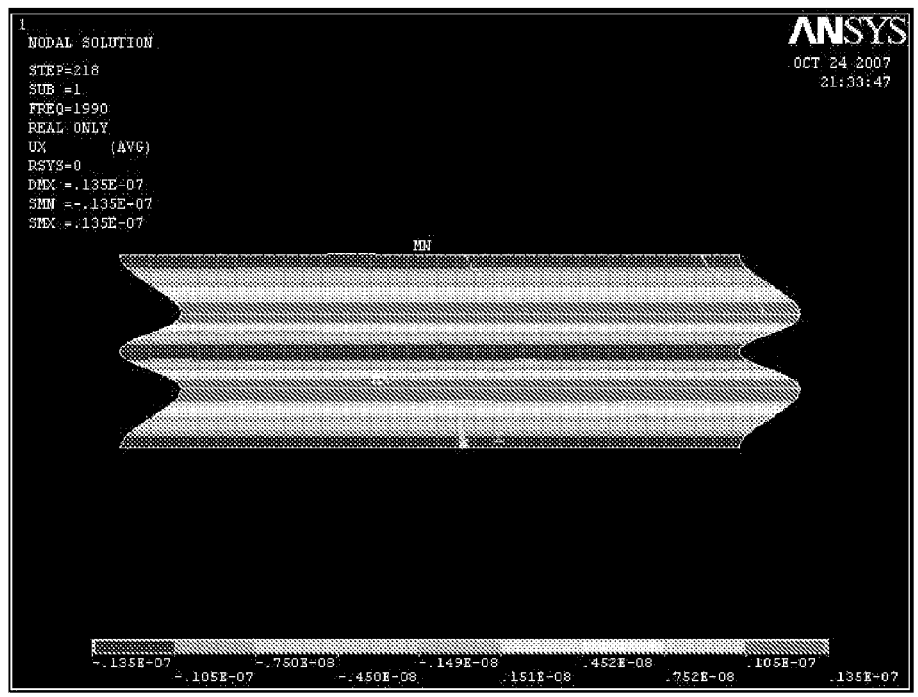
FIG. 11 shows the motion of the transformer in resonance.

Another potential application is a piezoelectric transformer (PT). A potential device, shown in FIG. 10, consists of a primary winding (top layer), matching layer, and secondary windings (bottom layer). The primary winding is a patterned AlN thin film, and the secondary one is a non-patterned, standard piezoelectric AlN film. A floating electrode can be added to the secondary winding. An input AC voltage is applied to primary winding and an output AC voltage is taken from the secondary one. In operation, the primary and secondary windings are acoustically coupled by thickness-shear mode of vibration through matching layers, as shown in FIG. 11. Excitation of shear wave is produced in the primary winding in the same way as in the resonator.

Nominal value for output/input transformation is equal to the number of periods in a patterned film. For the simulation shown in FIG. 11, it is equal to 2. However, it should be recognized that the transformation ratio also depends on loading of the PT.

A matching layer in the structure performs the role of acoustic connector and electrical isolator between windings.

LIST OF REFERENCES CITED

[1] Lakin, K. M., K. T. McCarron, and R. E. Rose. Solidly mounted resonators and filters. in IEEE Ultrasonics Symposium. 1995. Seattle (Washington, USA): IEEE, p 905-908.

[2] Ruby, R. C., P. Bradley, Y. Oshmyansky, A. Chien, and J. D. Larson. Thin film bulk acoustic wave resonators for wireless applications. in IEEE Ultrasonics Symposium. 2001. Atlanta: IEEE, p. 813-821.

[3] Lanz, R. and P. Muralt, Bandpass filters for 8 GHz using solidly mounted bulk acoustic wave resonators. IEEE Trans. UFFC, 2005. 52: p. 936-946.

[4] Wingqvist, G. Bjurstrom, J. Liljeholm, L. Katardjiev, I. Spetz, A. L., Shear mode AlN thin film electroacoustic resonator for biosensor applications. Sensors, 2005 IEEE, 2005, 4 p. 492-495.

[5] Martin, F. Muralt, P, Cantoni, M. and Dubois M.-A. Re-growth of c-axis oriented AlN thin films. In IEEE Ultrasonics Symposium 2004, p 169-172.

[6] E. Milyutin, S. Gentil, P. Muralt, Shear mode bulk acoustic wave resonator based on C-axis oriented AlN thin film, J. Appl. Phys. Vol. 104, no 084508 (2008).

The invention claimed is:

1. Acoustic wave resonator device comprising a resonant layer that comprises a series of laterally adjacent areas of first and second dielectric materials, of which one or both materials are piezoelectric, wherein either:

(a) the first dielectric material is a piezoelectric and the second dielectric material is a non-piezoelectric; or (b) the first and second dielectric materials are piezoelectrics of different piezoelectric properties;

wherein the piezoelectric material is AlN, ZnO or GaN; and wherein the resonator comprises an electrode system configured for excitation of shear thickness resonance of acoustic waves.

2. Acoustic wave resonator device of claim 1 (a) wherein the second dielectric material is a disordered piezoelectric material with substantially no net piezoelectric effect.

3. Acoustic wave resonator device of claim 1 (b) wherein the first dielectric material is a piezoelectric of first polarity and the second dielectric material is a piezoelectric of opposite polarity or of different polarity.

4. Acoustic wave resonator device of claim 1 wherein the resonant layer is supported on a reflector composed of series of layers of high acoustic impedance material(s) alternating with layers of low acoustic impedance material(s).

5. Acoustic wave resonator device of claim 4 wherein the reflector comprises at least one of AlN, Al2O3, Ta2O5, HfO2 or W as high impedance material and SiO2 as low impedance material.

6. Acoustic wave resonator device of claim 1 wherein the resonant layer is a membrane with mechanically free surfaces.

7. Acoustic wave resonator device of claim 1 comprising an electrode system configured for in-phase electric field production in the plane of piezoelectric parts of the resonant layer.

8. Acoustic wave resonator device of claim 1 comprising interdigitated electrodes.

9. Acoustic wave resonator device of claim 1 comprising a patterned electrodes system consisting of patterned electrodes made of an electrically-conductive first material separated by an electrically non-conductive second material with similar mechanical properties to the first material.

10. Acoustic wave resonator device of claim 9 wherein the first material of the electrodes is based on Al and the second material is SiO2.

11. A media sensing apparatus comprising an acoustic wave resonator device of claim 1.

12. A media sensing apparatus for liquid immersion comprising an acoustic wave resonator device of claim 1.

13. A piezoelectric transformer comprising:

an input part;

a matching part; and an output part, wherein the input part comprises an acoustic wave resonator device of claim 1, the output part comprises a piezoelectric material and the matching part is arranged to acoustically couple the input and output parts.

14. The piezoelectric transformer of claim 13 wherein the output part is made of AlN or ZnO.

15. The piezoelectric transformer of claim 13 wherein the matching part is made of SiO2.

16. Acoustic wave resonator device comprising a resonant layer that comprises a series of laterally adjacent areas of first and second dielectric materials, of which one or both materials are piezoelectric, wherein either:

(a) the first dielectric material is a piezoelectric and the second dielectric material is a non-piezoelectric; or (b) the first and the second dielectric materials are piezoelectrics of different piezoelectric properties;

wherein the piezoelectric material is AlN, ZnO or GaN; and wherein the resonator comprises an electrode system configured for excitation of a pure shear thickness resonance of the acoustic waves.

* * * * *